(12) United States Patent
Fujimori

(10) Patent No.: US 6,711,090 B2
(45) Date of Patent: Mar. 23, 2004

(54) SEMICONDUCTOR STORAGE UNIT

(75) Inventor: Yasuhiko Fujimori, Tokyo (JP)

(73) Assignees: NEC Corporation, Tokyo (JP); NEC Electronics Corporation, Kanagawa (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/160,331

(22) Filed: May 30, 2002

(65) Prior Publication Data
US 2002/0181318 A1 Dec. 5, 2002

(30) Foreign Application Priority Data
May 31, 2001 (JP) ........................ 2001/165591

(51) Int. Cl.[7] .............................................. G11C 8/00
(52) U.S. Cl. ..................... 365/233; 365/194; 365/229; 327/158; 327/163
(58) Field of Search ............................. 366/233, 194, 366/229; 327/185, 163

(56) References Cited
U.S. PATENT DOCUMENTS
6,229,363 B1 * 5/2001 Eto et al. ................ 327/158
6,385,127 B1 * 5/2002 Ikeda ........................ 365/233

FOREIGN PATENT DOCUMENTS
JP    8-237091    9/1996
JP    11-66854    3/1999

* cited by examiner

Primary Examiner—David Lam
(74) Attorney, Agent, or Firm—Choate, Hall & Stewart

(57) ABSTRACT

The semiconductor storage unit comprises a clock first-stage circuits into which clock signals CLK and CLKB are entered; an output circuit which outputs data stored in the memory cell by a BDD signal BDDO generated in synchronization with the external clock signals and generated by external input signals; a delay adjusting circuit which corrects an output phase shift between the clock signal CLK and data caused by a delay between the CLK first-stage circuits and the output circuit by delaying the BDD signal BDDO, and comprises replica circuits synchronizing between the clock signal CLK and data and delay circuits; and a control circuit which controls operation and stoppage of these delay circuits individually.

7 Claims, 10 Drawing Sheets

|  | CL1.5 | CL2.0 | CL2.5 |
|---|---|---|---|
| BDDI | H | H | H |
| BDDBI | L | H | H |
| CLKI | L | L | H |
| CLKBI | L | H | H |

|      | CL1.5 | CL2.0 | CL2.5 |
|------|-------|-------|-------|
| BDDI | H     | H     | H     |
| BDDBI| L     | H     | H     |
| CLKBI| L     | L     | L     |

SEMICONDUCTOR STORAGE UNIT

BACKGROUND OF THE INVENTION

The present invention relates to a high-speed operating semiconductor storage unit (or device) having internal circuits operating in synchronization with an external clock.

More particularly, the invention is directed to a semiconductor storage unit producing two or more data in a cycle of the external clock so as to reduce the power consumption resulting from the supply of the external clock.

Along with the recent tendency toward a higher-speed CPU (Central Processing Unit), the rate of the clock cycle used in memories such as an SDRAM (Synchronous Dynamic RAM) has become higher, and the delay time relative to the clock cycle has become larger. This is now affecting a circuit operation.

As a result, it is the usual practice to avoid a delay relative to external clock by conducting phase control including control of a delay in input buffers and output buffers by means of PLL, and align the phase of internal clock relative to the entered external clock.

In order to improve the rate of reading and writing data in the memory, a process known as the double data rate (DDR) method has been conceived, which comprises transferring data upon startup and end of the clock cycle, and a transfer rate substantially twice as high clock cycle has been achieved.

However, when an output clock of DDR is generated by the use of an existing PLL circuit shown in FIG. 1, many clock cycle is required before elimination of a phase difference between an external clock signal and an output clock, and the power consumption becomes larger in the cause of a high-speed clock.

More specifically, a phase comparator 80 divides a VCO 82 output amplified by means of an AMP.40 into an internal clock CKi by use of a dividing circuit 87, compares a signal delayed by a delay circuit 88 and an external clock CKo entered from an input circuit 101 via a terminal 100, and issues or produces a phase error signal Δck.

A voltage controlling oscillator 82 generates an internal clock CKi having a frequency corresponding to the phase error signal Δck entered via a low-pass filter 81, and supplies the same to the internal circuit 90.

By adopting a configuration of the dividing circuit 87 in which a frequency corresponding to a half the entered frequency, the voltage controlling oscillator 82 generates an internal clock CKi with a frequency twice as high as the external clock CKo.

By combining the PLL circuit with the dividing circuit, it is possible to obtain an internal clock CKi for double rates having a phase difference of 180°. However, before elimination of the phase difference between the output clock CKi and external clock signal CKo, the PLL requires input of many external clocks CKo, and the resultant increase in number of clock cycles leads to an increase in power consumption.

To solve such inconvenience, a delay circuit train has been developed as an improved PLL circuit, which permits accurate positional alignment at a higher rate and with a smaller number of clocks and achievement of a lower power consumption, using an SMD (Synchronous Mirror Delay) circuit and a BDD (Bi-Directional Delay). as disclosed in Japanese Unexamined Patent Publications Nos. 8-237091 and 11-066854.

In the BDD circuit and the SMD circuit, the delay portion is turned up, an error in the propagation time caused by fluctuations in the manufacturing process, in the forward period and in the backward period is offset. These delay circuits free from dispersions in timing even upon a change in the cycle time compose the delay circuit train including replica circuits (or dummy circuits) of input and output buffers. This delay circuit train suffices to have only two cycles for elimination of phase differences.

In the above-mentioned existing art, however, while it is possible to cause the phase of output data to cope with a higher rate relative to the external clock, stop control of the SMD circuit and the BDD circuit is not carried out during active power down because of the restriction imposed by the CAS latency.

Herein, it is to be noted that the term "active power down" as used herein means a state in which, after input of an active command (ACT) which activates a low-address of a bank selected by an address, supply of the internal clock to outside the delay circuit train including the SMD circuit or the BDD circuit is discontinued, bringing the clock enable signal into a disable state.

A BDD signal generating circuit (delay circuit train) including a BDD circuit in an existing semiconductor storage unit is illustrated in FIG. 2.

In such a BDD signal generating circuit, delay lines 17, 18, 19 and 20 generate BDD signals (output clocks) of phase A, phase B, phase C and phase D, respectively, having a phase shift of 90° to two cycles of the output clock signal, i.e., the external clock signal, used for data output based on the DDR method through control of BDD selecting circuits 11 and 12.

When stopping operation for saving power, an existing BDD signal generating circuit has a configuration in which by stopping a CLK first-stage circuit 1 and a CLKB first-stage circuit 2, supply of the external clock is discontinued to the subsequent circuits.

When the clock first-stage enable signal is brought into the disable condition, and the CLK first-stage circuits 1 and 2 are stopped, during active power down for the purpose of saving power, two cycle of external clock are required for generating a BDD signal. Upon returning to the active state, therefore, it is impossible to generate BDD signals corresponding to values of CAS latency (particularly, CAS latency of 2.0 or 1.5) from the read command (READ).

As is understood from the timing chart of an existing method illustrated in FIG. 3, therefore, the clock first-stage enable signals supplied, respectively, to the CLK first-stage circuit 1 and the CLKB first-stage circuit 2 are not in the disable state, but in the enable state (negative logic) even during active power down.

As described above, the existing BDD signal generating circuit, which operates even during active power down by means of a high-speed clock, has a problem of an excessive power consumption in spite of the power-down state.

SUMMARY OF THE INVENTION

It is therefore an object of this invention to provide a semiconductor storage unit which generates a control signal controlling power down in a BDD signal generating circuit during active power down to match with a value of CAS latency and applying power-down control to each of delay circuit trains including a BDD circuit (or SMD circuit), thereby permitting reduction of power consumption during active power down.

The semiconductor storage unit of the present invention comprises a clock input first-stage circuit for input of an external clock signal; an output circuit issuing data stored in memory cells in synchronization with an output clock generated on the basis of the external clock signal; a delay adjusting circuit composed of a plurality of delay circuits, which corrects a phase shift between the external clock and a data output by delaying the output clock and achieves synchronization between the external clock signal and the data; and a control circuit which controls operation and stoppage for each of the plurality of delay circuits.

In the semiconductor storage unit of the invention, the control circuit controls operations of each of the plurality of delay circuits on the basis of CAS latency during active power down.

In the semiconductor storage unit of the invention, the control circuit controls which of the plurality of delay circuits is to be operated or stopped, on the basis of the value of CAS latency.

In the semiconductor storage unit of the invention, the delay adjusting circuit comprises replica circuits including the clock input first-stage circuit and the output circuit, and an adjusting delay circuit which adjusts propagation to an arbitrary amount of delay.

In the semiconductor storage unit of the invention, the adjusting delay circuit adjusts the amount of delay by turning up propagation of the signal at a prescribed point on a delay line, in response to the set amount of delay, in the delay line having a turn-up in the interior.

The control method of a semiconductor storage unit of the invention comprises a clock input step of entering an external clock signal into the clock input first-stage circuit; a clock generating step of generating an output clock on the basis of the external clock signal; a data output step of issuing data stored in a memory cell in synchronization with the output clock; a delaying step of correcting a phase shift between the external clock and the data output through a delay adjusting circuit comprising a plurality of delay circuits, and achieving synchronization between the external clock signal and the data; and a controlling step of controlling operation and stoppage for each of the plurality of delay circuits.

In the control method of a semiconductor storage unit, in the control step during active power down, operation of each of the plurality of delay circuits is controlled on the basis of CAS latency.

In the control method of a semiconductor storage unit of the invention, in the control step during active power down, control is performed as to which of the plurality of delay circuits is to be operated or stopped.

In the control method of a semiconductor storage unit of the invention, in the delaying step, the amount of delay is adjusted by means of replica circuits including the clock input first-stage circuit and the output circuit, and an adjusting delay circuit which adjusts propagation to an arbitrary amount of delay.

DESCRIPTION OF PREFERRED EMBODIMENTS

Embodiments of the semiconductor storage unit of the present invention will be described using an example of SDRAM (Synchronous Dynamic RAM) permitting setting of an active power down.

The BDD signal generating circuit of the invention is applicable also to the memories using DDR-type data output and permitting setting of active power down.

While a BDD circuit is used as an example in the following description, the invention is applicable also to a configuration using an SMD circuit and the phase of an external clock signal is matched with that of the output data.

The BDD signal generating circuit of the invention has a configuration in which, after input of a read command (READ) during active power down, the power consumption during active power down is further reduced by partially stopping the individual circuits composing the BDD signal generating circuit in response to the value of CAS latency while satisfying read operation corresponding to the CAS latency.

More specifically, which of the BDD processing circuits is to be stopped is determined, depending upon the CAS latency specifying after how many clock cycles (hereinafter referred to as cycle) from input of the read command the read data are to be issued as an output.

As a result, the BDD signal generating circuit of the invention has a control circuit generating enable signals which activate and deactivate the above-mentioned circuits, depending upon the value of CAS latency during active power down.

Embodiments of the present invention will now be described with reference to the drawings.

Figure 4:
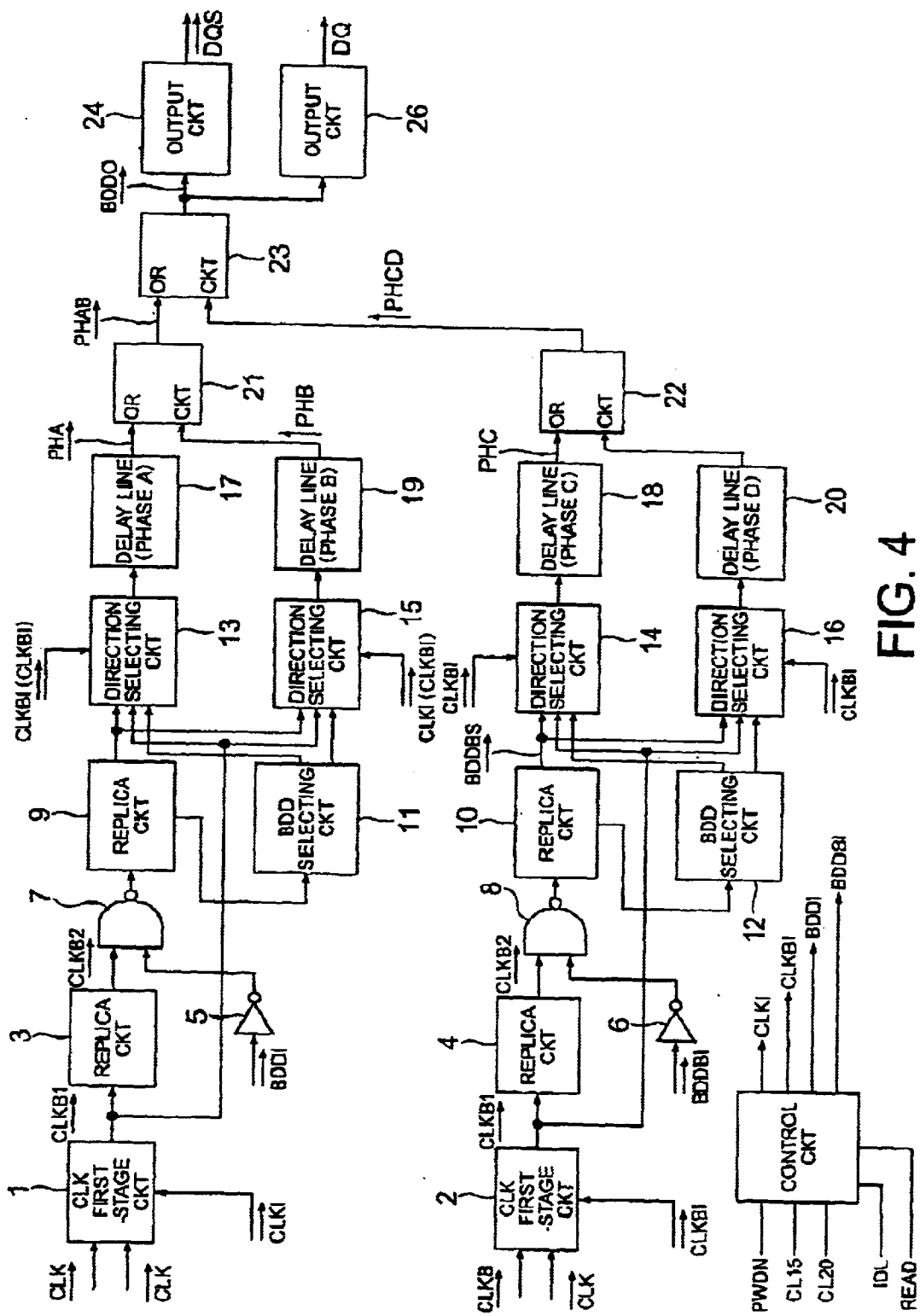
FIG. 4 is a block diagram illustrating the configuration of a BDD signal generating circuit (including a data output circuit) of the semiconductor storage unit of a first (or second) embodiment of the present invention.

Referring to FIG. 4, circuits having no direct relationship with the description of the invention such as a memory cell area, an address decoder and a sense amplifier in SDRAM are omitted to facilitate understanding, and the description will center around the BDD signal generating circuit generating an output clock which controls data output based on the DDR method, i.e., a BDD signal. Data read out from the memory cell not shown in a number corresponding to the burst length are retained in the latch in the output circuit 26, and burst data DQ are sequentially issued as output in response to the above-mentioned BDD signal (BDD signal BDDO described later).

The output circuit 24 issues a DQS signal (data strobe signal) in synchronization with the BDD signal issued first, in the output string of the above-mentioned BDD signals, one cycle prior to output of the first data of burst data DQ.

This BDD signal generating circuit generates a BDD signal BDDO given to the output circuit 24, by separately generating BDD signals for CLK, PHA and PHB corresponding to startup of the clock signal CLK and BDD signals for CLKB, PHC and PHD corresponding to startup of the clock signal CLKB in a CLK circuit system and a CLKB signal system, respectively, and finally synthesizing these BDD signals.

The control circuit 25 generates, as described later in detail, a CLK first-stage enable signal CLK1, a CLKB first-stage enable signal CLKB1, a CLK BDD enable signal BDDI, and a CLKB BDD enable signal BDDBI in response to values of CAS latency, and controls operation and stoppage of the individual circuits described later of the BDD signal generating circuits.

The CLK circuit system following the CLK first-stage circuit 1 which generates the CLK BDD signals PHA and PHB corresponding to startup of the clock signal CLK will be described.

The CLK first-stage circuit 1 includes an input buffer for the clock signal CLK, and generates a CLK first-stage output signal CLK1 which generates a BDD signal BDDO used for data output based on the DDR method from the cross point of the entered clock signal CLK and the clock signal CLKB.

The replica circuits 3 and 9 has a circuit configuration and gate circuit similar to those of the first-stage circuit 1 and the output circuits 24 and 26, gives a delay time larger than the delay time of the first-stage circuit 1 and the output circuits 24 and 26 to the input clock CLK1, and issues the same as an output BDD signal BDDS.

A NAND circuit 7 controls whether or not to communicate an output signal CLK2 issued by the replica circuit 3 to the next-stage replica circuit 9. on the basis of the CLK enable signal BDD1.

A BDD selecting circuit 11 performs control as to which of the direction selecting circuit 13 and the direction selecting circuit 15 a CLK BDD start signal BDD is to be issued.

Upon input of the CLK BDD start signal BDD, the direction selecting circuits 13 and 15 issue a propagation signal to the individual delay lines 17 and 19 to cause start of delaying operation, and at a turnup point in the cycle time period of the next CLK signal CLK, turns up the signal at prescribed positions of the delay lines 17 and 19 to convert propagation direction of the above-mentioned propagation signal.

The above-mentioned turnup point is a set value representing the time from startup of the second cycle CLK signal to turnup during two cycle times of the CLK signal generating the BDD signal, and set upon changing the CLK frequency such as upon startup of the semiconductor storage unit for the purpose of adjusting the amount of delay of the delay time of the BDD signal BDDO relative to the clock signal CLK.

More specifically, the direction selecting circuits 13 and 15 change the propagating direction of the signal at the turnup point during the cycle period of the next CLK signal CLK on the respective delay lines 17 and 19, and perform delay of the CLK BDD start signal BDDS with the period to the turnup and the period from turnup to output of the signal as delay times.

The delay lines 17 and 19 issue the CLK BDD signals PHA and PHB, respectively, resulting from delaying of the CLK BBD start signal BDDS in the above-mentioned amount of delay.

An OR circuit 21 takes the logical sum of the CLK BDD signals PHA and PHB, and output the result as a CLK BDD signal PHAB.

The CLK circuit system following the CLK first-stage circuit 2, which generates CLKB BDD signals PHC and PHD corresponding to startup of the clock signal CLKB will now be described.

The CLKB first-stage circuit 2 includes an input buffer for the clock signal CLKB, and generates a CLKB first-stage output signal CLKB1 which prepares the BDD signal BDDO used for DDR-type data output, from the cross point of the entered clock signal CLK and the clock signal CLKB.

Replica circuits 4 and 10 have circuit configurations similar to those of the first-stage circuit 1 and the output circuit 24, gives a delay time larger than the delay time of the first-stage circuit 1 and the output circuit 24, and output the same as the CLKB BDD start signal BDDBS.

A NAND circuit 8 controls whether or not the output signal CLKB2 issued by the replica circuit 4 is to be communicated to the next-stage replica circuit 10, on the basis of the CLKB enable signal BDDBI.

A BDD selecting circuit 12 performs control to which of the direction selecting circuit 14 and the direction selecting circuit 16 the CLKB BDD start signal BDDBS is to be issued.

Upon input of the CLKB BDD start signal BDDBS, the direction selecting circuits 14 and 16 issue propagation signals to the delay lines 18 and 20, respectively to cause start of delaying operation, and at the turnup point in the cycle time of the next CLK signal CLK, converts the propagating direction of the above-mentioned propagation signal.

More specifically, the direction selecting circuits 14 and 16 change the propagating direction of the signal at the turnup point during the cycle period of the next CLK signal on the respective delay lines 18 and 20, and perform delay of the CLKB BDD start signal BDDBS with the period to the turnup and the period from turnup to output of the signal as delay time.

The delay lines 18 and 20 issue the CLKB BDD signals PHC and PHD, respectively, resulting from delaying of the CLKB BDD signal BDDBS in the above-mentioned amount of delay.

An OR circuit 22 determines the logical sum of the CLKB BDD signals PHC and PHD, and outputs the same as a CLKB BDD signal PHCD.

An OR circuit 23 determines the logical sum of the CLKB BDD signal PHAB and the CLKB BDD signal PHCD, and outputs the same as a BDD signal BDDO.

The above-mentioned CLK BDD signal PHA, the CLKB BDD signal PHC, the CLK BDD signal PHB and the CLKB BDD signal PHD have phase shifts of a half cycle of the clock signal CLK, respectively.

An output circuit 26 sequentially outputs by the DDR method, data read out from the memory cell not shown and accumulated in the internal latch, in synchronization with the BDD signal BDDO.

An example of configuration of the control circuit 25 will be described with reference to FIGS. 5 and 6.

Figures 5, 6:
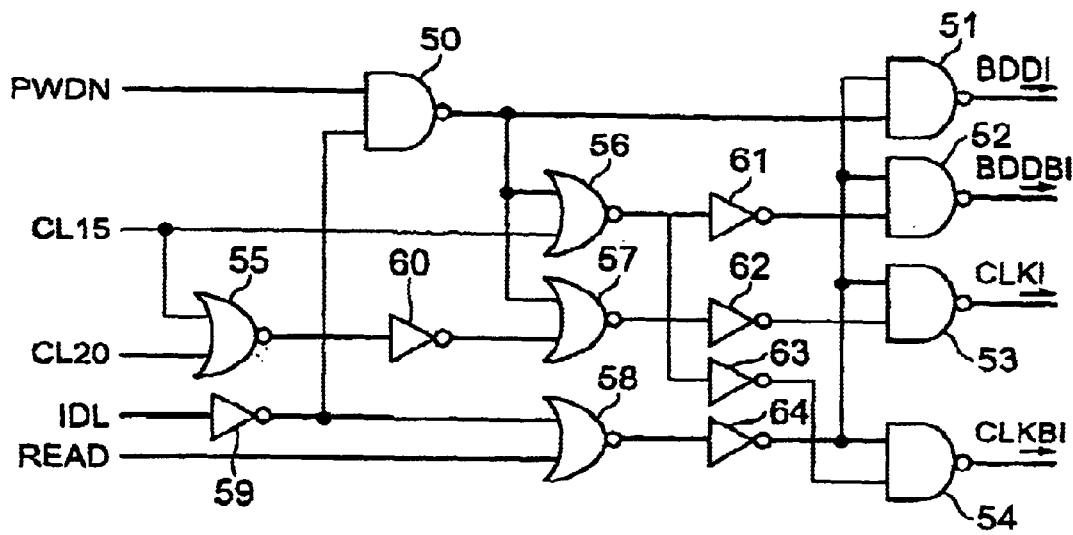
FIG. 5 is a block diagram illustrating the configuration of a control circuit 25 (first embodiment) shown in FIG. 4.
FIG. 6 is a table showing the relationship between the value of CAS latency and individual enable signals during active power down of the control circuit 25 (first embodiment) shown in FIG. 4.

FIG. 6 is a table showing correspondence between values of CAS latency during active power down and the CLK first-stage enable signal CLK1, the CLKB first-stage enable signal CLKBI, signal BDDBI, at respective output levels, on the basis of the circuit shown in FIG. 5.

Referring to FIG. 5, 50 to 54 represent NAND circuits, 55 to 58, NOR circuits, and 59 to 64, NOT circuits (inverters).

Signals used for the control circuit 25 will first be described.

A control signal PWDN is activated upon input of the enable state level into, for example, a clock enable terminal of the semiconductor storage circuit, becoming on "L" level, and deactivated upon input of the disable state level, becoming on "H" level.

A control signal READ, which is an internal signal generated by the read command, is supplied on "H" level when reading out stored data, and supplied on "L" level in cases other than reading of data.

A control signal IDL becomes on "L" level when an active command activating the bank of the memory cell shown by a specified low address, and idle state waiting the next command read or write is reached.

In the active power down state, therefore, the level of the above-mentioned control signals is as follows: the control signal PWDN is on "H" level; the control signal READ is on "L" level; and the control signal IDL in on "L" level.

Control signals CL 20 and 15 on levels set by the mode register set command, on the basis of the value of CAS latency stored in the register.

That is, the control signal CL 20 becomes on "H" level when the CAS latency is "2.0", and on "L" level when the CAS latency is "2.5" or "1.5".

The control signal CL 15 becomes on "H" level when the CAS latency is "1.5", and on "L" level when the CAS latency is "2.5" or "2.0".

Figure 3:
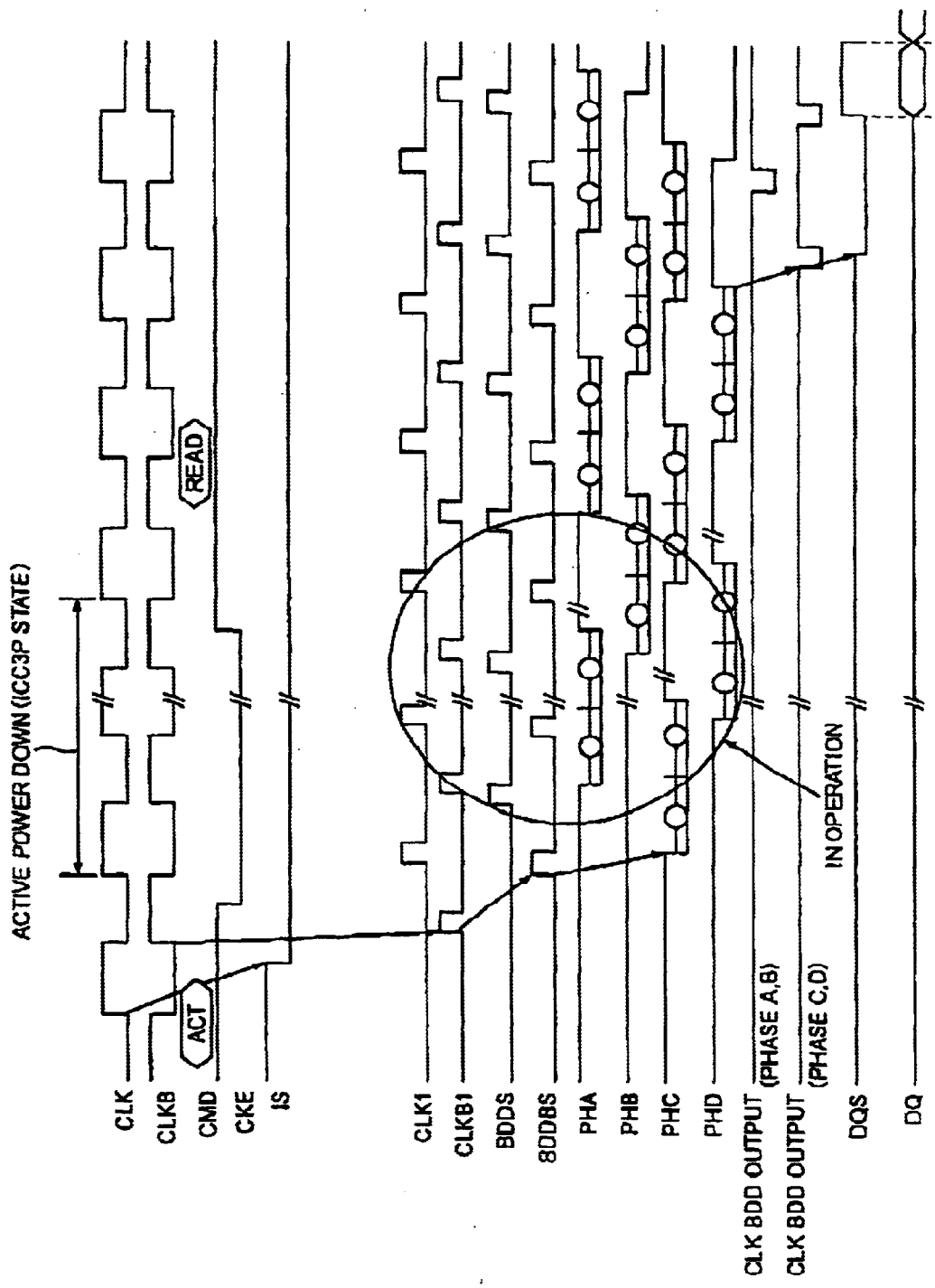
FIG. 3 is a timing chart illustrating operation of the BDD signal generating circuit shown in FIG. 2.

During active power down, on the basis of the state of the above-mentioned control signals, as shown in the table of FIG. 3, the CLK BDD enable signal BDDI, the CLKB BDD enable signal BDDBI, the CLK first-stage enable signal CLKI, and the CLKB first-stage enable signal CLKBI are on "H", "L", "L" and "L", respectively, when the CAS latency is "1.5"; on "H", "H", "L" and "H", respectively when the CAS latency is "2.0"; and on "H", "H", "H" and "H", respectively, when the CAS latency is "2.5".

The above-mentioned CLK BDD enable signal BDDI, the CLKB BDD enable signal BDDBI, the CLK first-stage enable signal CLKI, and the CLKB first-stage enable signal CLKBI are assumed to be on "L" active.

Referring back to FIG. 4, the CLK first-stage enable signal CLKI controls operations of the CLK first-stage circuit 1, and the direction selecting circuits 13 and 15.

The CLKB first-stage enable signal CLKBI controls operations of the CLKB first-stage circuit 2, and the direction selecting circuits 14 and 16.

The CLK BDD enable signal BDD is entered into the inverter 5, and controls signal communication of the NAND circuit 7.

The CLKB BDD enable signal BDDBI is entered into the inverter 6, and controls signal communication of the NAND circuit 8.

As described above, the semiconductor storage unit of the first embodiment shown in FIG. 4 has a delay amount adjusting circuit composed of delaying circuits such as the replica circuits 3, 4, 9 and 10 and the delay lines 17 to 20, and the CLK first-stage enable signal CLKI, the CLKB first-stage enable signal CLKBI, the CLK BDD enable signal BDDI, and the CLKB BDD enable signal BDDBI generated by the control circuit 25 control individual operation/stoppage of the aforementioned delaying circuits in response to a value of CAS latency, thus reducing the power consumption in response to the CAS latency.

Reduction of the power consumption during active power down through control of operation/stoppage of the BDD generating circuit in the first embodiment will now be described with reference to drawing.

Operating/stoppage states of the BDD generating circuit during active power down when the CAS latency is "2.5" will first be described with reference to FIGS. 4 and 7.

Figure 7:
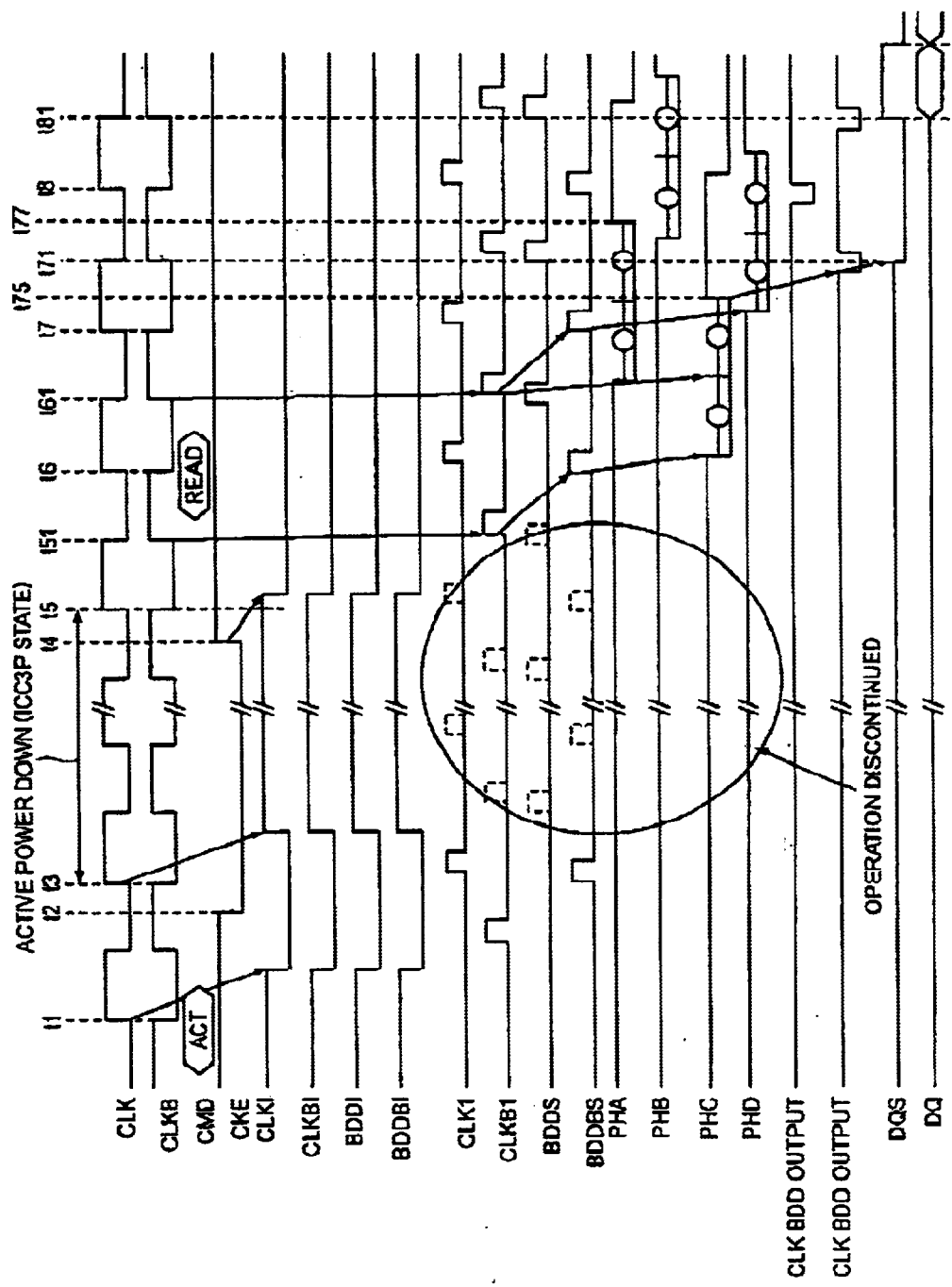
FIG. 7 is a timing chart illustrating a typical operation during active power down in a case with a CAS latency of 2.5 in the first embodiment.

FIG. 7 is a timing chart describing the stoppage state of the BDD signal generating circuit during active power down when the CAS latency is "2.5", and operation upon input of the read command after release of active power down.

As is clear from FIG. 7, when the state transfers from stoppage of the BDD signal generating circuit in active power down to active state, it is possible to enter the read command into a cycle next to the cycle in which the active state is reached in the shortest period of time. After the lapse of 2.5 cycles from input of the read command, it is necessary to output the first data of the burst data.

The DQS signal issued one cycle prior to output of the burst data DQ must be output in synchronization with startup of the clock signal CLKB after the lapse of 1.5 cycles from the read command.

In order to generate a BDD signal, it is necessary to provide two cycles of clock signal CLK, and the CLKB first-stage circuit 2 must start operation half a cycle prior to input of the read command.

The clock enable signal CKE changes its level from "L" to "H", and after release of the active power down state by the next clock signal CLK, the read command is entered after the lapse of one cycle on the minimum. One cycle and 2.5 cycles of CAS latency, i.e., 3.5 cycles in total after release of the active power down, it is possible to output the first burst data DQ.

As a result, when the CAS latency is "2.5", it is possible to discontinue operation of all the BDD signal generating circuits, thus permitting reduction of the power consumption.

Operations during active power down for a CAS latency of 2.5 will now be described.

At time t1, the active (ACT) command is entered. The clock enable signal CKE is in enable state ("H" level), and the active state is achieved.

The control signal IDL therefore becomes "L" level. The control signal PWDN is on "L" level, and the control signal READ is on "L" level.

Therefore, all of the CLK BDD enable signal BDDI, the CLKB BDD enable signal DDBI, the CLK first-stage enable signal CLKI, and the CLKB first-stage enable signal CLKBI issued by the control circuit 25 are output in the enable state ("L" level).

As a result, in the BDD signal generating circuit, all the circuits including the CLK first-stage circuit 1, the CLKB first-stage circuit 2, the NAND circuits 7 and 8, and the direction selecting circuits 13, 15, 14 and 16 are activated, and all the circuits are thus in the operating state.

Then, at time t2, the clock enable signal CKE changes its level to "L". Startup of the clock signal at time t3 the control signal PWDN transfers from "L" level to "H" level. The operating mode of the semiconductor storage unit transfers to the active power down state.

Both the control signals CL15 and CL20 are on "L" level. The control circuit 25 outputs all of the CLK BDD enable signal BDDI, the CLKB BDD enable signal BDDBI, the CLK first-stage enable signal CLKI, and the CLKB first-stage enable signal CLKBI in the disable state ("H" level).

Accordingly, all the circuits of the BDD signal generating circuit including the CLK first-stage circuit 1, the CLKB first-stage circuit 2, the NAND circuits 7 and 8, and the direction selecting circuits 13, 15, 14 and 16 are deactivated, and all the circuits are brought into the stop state.

At time t4, the clock enable signal CKE changes its level to "H", and the control signal PWDN transfers from "H" level to "L" level. The operating mode of the semiconductor storage unit is therefore released from the active power down state, transfers to the standby state, and al the circuits including the CLK first-stage circuit 1, the CLKB first-stage circuit 2, the NAND circuits 7 and 8, and the direction selecting circuits 13, 15, 14 and 16 are activated.

At time t51, startup of the clock signal CLKB causes the CLKB first-stage circuit 2 outputs the CLKB first-stage output signal CLKB1.

Then, replica circuit 4 delays the CLKB first-stage output signal CLKB1 and outputs the same as an output signal CLKB2 to the replica circuit 10 via the NAND circuit 8.

The replica circuit 10 delays the output signal CLKB2, and outputs the same as the same as the CLKB start signal BDDBS.

At this moment, in the BDD selecting circuit 12, the delay line 20 is assumed to be set to the state "in use".

The BDD selecting circuit 12 controls the direction selecting circuit 14 to enter the above-mentioned CLKB BDD start signal BDDBS and start delaying processing in the delay line 18, on the basis of the control signal issued by entering the output signal CLKB2 by the replica circuit 10.

As a result, the direction selecting circuit 14 causes start of delay in the delay line 18 on the basis of the entered CLKB BDD start signal BDDBS.

The delay line 18 starts output of the negative logic CLKB BDD signal PHC.

Then, at time t6, the control signal READ generated by the read command transfers from "L" level to "H" level at the timing of the clock signal CLK.

The CLK first-stage circuit 1 outputs the CLK first-stage output signal CLK1 upon startup of the clock signal CLK.

Then, the replica circuit 3 delays the CLK first-stage output signal CLK1 and outputs the same as an output signal CLK2 to the replica circuit 9 via the NAND circuit 7.

The replica circuit 9 delays the output signal CLK2, and outputs the same as the CLK start signal BDDS.

At this moment, the BDD selecting circuit 11 assumes the delay line 19 to have been set to the "in use" state.

The BDD selecting circuit 11 controls the direction selecting circuit 13 to enter the above-mentioned CLK BDD start signal BDDS and start delaying processing in the delay line 17, on the basis of the control signal issued by entering the output signal CLK2 by the replica circuit 9.

As a result, the direction selecting circuit 13 causes start of delay in the delay line 17 on the basis of the entered CLK BDD start signal BDDS.

The delay line 17 starts output of the negative logic CLK BDD signal PHA.

Then, at time t61, upon startup of the clock signal CLKB, the CLKB first-stage 2 outputs the CLKB first-stage output signal CLKB 1.

As at time t51, the replica circuits 4 and 10 output the output signal CLKB2 and the CLKB start signal BDDBS, respectively.

At this point in time, the direction selecting circuit 14 reverses the direction of propagation of the signal through the delay line 18 on the basis of the above-mentioned output signal CLKB2.

That is, the direction selecting circuit 14 turns up the signal propagation for delaying through the delay line 18.

In this case, since the delay line 18 is set to the "in use" state, the BDD selecting circuit 12 outputs a control signal for performing turnup processing to the direction selecting circuit 14 on the delay line 18.

The BDD selecting circuit 12 performs control so as to cause the direction selecting circuit 16 to enter the above-mentioned CLKB BDD start signal BDDBS to start delaying processing through the delay line 20, on the basis of the control signal issued upon input of the output-signal CLKB2 by the replica circuit 10.

As a result, the direction selecting circuit 16 causes start of delaying through the delay line 20 on the basis of the entered CLKB BDDS start signal BDDBS.

The delay line 20 starts output of the negative logic CLKB BDD signal PHD.

Then, at time t7, the CLK first-stage circuit 1, outputs the CLK first-stage output signal CLK1 by startup of the clock signal CLK.

Then, the replica circuits 3 and 9 output, as at t6, the output signal CLK2 and the CLK start signal BDDS, respectively.

At this moment, the direction selecting circuit 13 reverses the direction of propagation of the signal in the delay line 17, on the basis of input of the above-mentioned output signal CLK2.

That is, the direction selecting circuit 13 turns up signal propagation for delaying through the delay line 17.

The BDD selecting circuit 11 outputs the control signal for turnup processing to the direction selecting circuit 13 on the delay line 17, because the delay line 17 is already set to "in use".

The BDD selecting circuit 11 causes the direction selecting circuit 15 to enter the above-mentioned CLK BDD start signal BDDS to start delaying processing through the delay line 19 on the basis of the control signal output upon input of the output signal CLK2 by the replica circuit 9.

As a result, the direction selecting circuit 15 causes start of delay on the delay line 19 on the basis of the entered CLK BDD start signal BDDS.

The delay line 19 starts output of the negative logic CLK BDD signal PHB.

Then, at time t75, the delay line 18 completes propagation of the delay element after turnup, and the CLKB BDD signal PHC is started up.

The OR circuit 22 outputs the negative logic CLKB BDD signal PHCD on the basis of startup of this CLKB BDD signal PHC.

As a result, at time t71, the OR circuit 23 outputs the BDD signal BDDO to the output circuit 24, and the output circuit 24 outputs the DQS signal.

This data strobe signal is issued in synchronization with the end of the clock signal CLK 1.5 cycles after input of the read command.

At time t77, the delay line 17 similarly completes entire propagation of the delay elements after turnup, and the CLK BDD signal PHA is started up.

The OR circuit 21 outputs the negative logic CLK BDD signal PHAB on the basis of startup of the CLK BDD signal PHA.

As a result, at time t81, the OR circuit 23 outputs the BDD signal BDDO to the output circuit 26, and the output circuit 26 outputs top data of the burst data.

The top data of the burst data are issued in synchronization with end of the clock signal CLK at time t81 which is the timing 2.5 cycles after input of the read command, i.e., at a CAS latency of 2.5.

BDD signals BDDO are sequentially output from the OR circuit 23 as above thereafter, and data read out in the latch of the output circuit 26 are output from the semiconductor storage unit time-serially as burst data.

Figure 1:
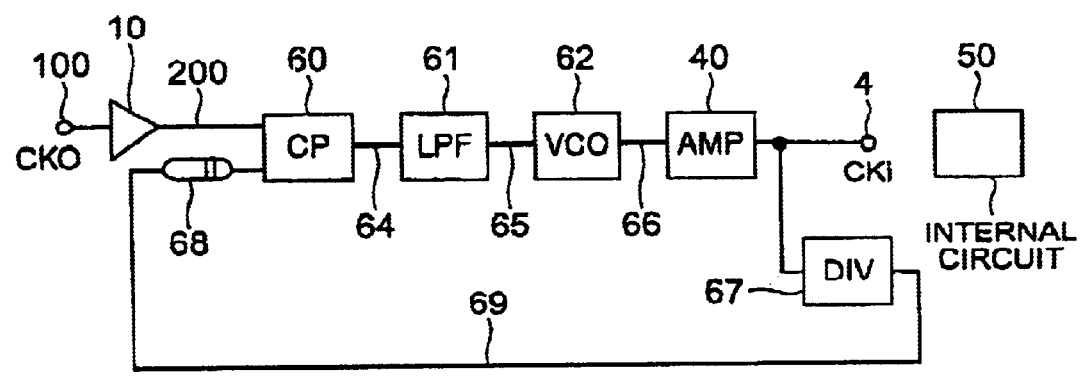
FIG. 1 illustrates a timing adjusting circuit of an existing output clock based on the DDR method.
Figure 2:
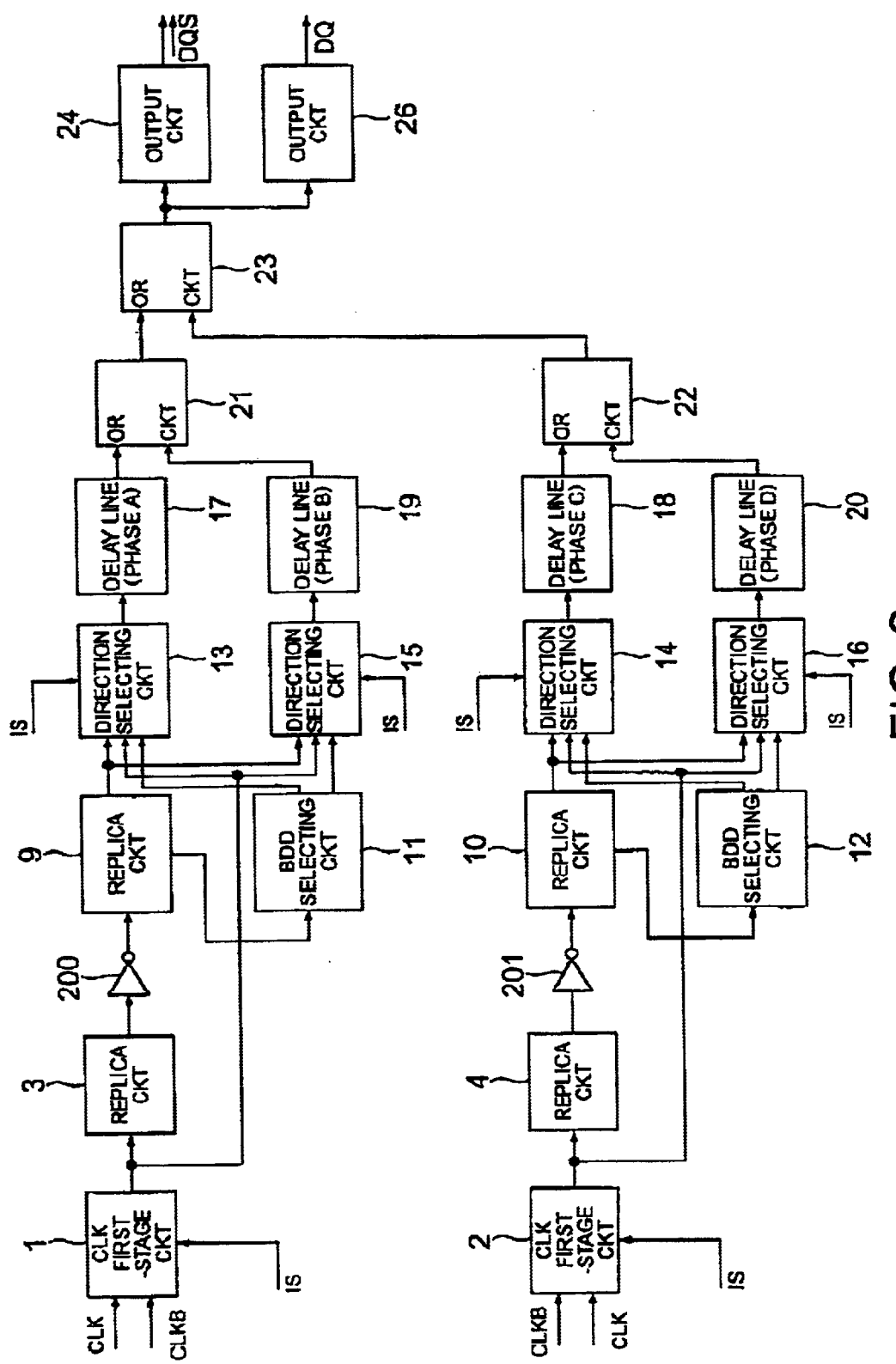
FIG. 2 is a block diagram illustrating a configuration of a BDD signal generating circuit including a BDD circuit in an existing semiconductor unit.

Operation/stoppage state of the BDD generating circuit during active power down in a case with a CAS latency of "2.0" will be described with reference to FIGS. 1 and 5.

FIG. 5 is a timing chart for explaining the stoppage state of the BDD signal generating circuit during active power down with a CAS latency of "2.0", and operation upon release of active power down and input of the read command.

As is clear from FIG. 5, when the state of the BDD signal generating circuit changes from stoppage to active during active power down, it is necessary to output the first burst data 2.0 cycles after input of the read command.

The DQS signal (data strobe signal) issued one cycle prior to output of the data must therefore be output in synchronization with startup of the clock signal CLK 1.0 cycle after the read command.

In order to generate a BDD signal, however, it is necessary to use two cycles of clock signal CLK, and the CLK first-stage circuit 1 must start operation one cycle prior to input of the read command.

At this moment, the level of the clock signal CKE changes from "L" to "H", and the read command is entered after the lapse of one cycle on the minimum from release of the active power down state by the next clock signal CLK. After the lapse of one cycle and two cycles of CAS latency, 3.0 cycles from release of the active power down state, the first of the burst data DQ are output.

It is necessary to generate the BDD signal for starting up the clock signal CLK at time t5. When the CKL first-stage enable signal CLKI is in a disable state, however, if the entire circuits are stopped in the control at a CAS latency of 2.0, there occurs a shortage of 0.5 cycles for the startup timing of the clock signal CLK in the processing cycle.

As a result, it is impossible to stop all the circuits of the BDD signal generating circuits. In the case of a CAS latency 2.0, the level of the CLK first-stage enable signal CLKI is changed by the control circuit 25 to "L". Only the CLK first-stage circuit 1 and the replica circuit 3 are operated, and the other circuits are stopped. This permits reduction of the power consumption corresponding to the other circuits.

Processing of action power down at a CAS latency of 2.0 will now be described.

At time t1, the active command is entered. The clock enable signal CKE is in the enable state ("H" level) which is the active state as in the case of a CAS latency of 2.5. As a result of activation of all the circuits of BDD signal generating circuit including the CLK first-stage circuit 1, the CLKB first-stage circuit 2, the NAND circuits 7 and 8, and the direction selecting circuits 13, 15, 14 and 16, all the circuits are activated.

Then, at time t2, the level of the clock enable signal CKE is changed to "L". Since startup of the clock signal CLK at time t3 causes transfer of the control signal PWON from "L" level to "H" level, the operating mode of the semiconductor storage unit transfers to the active power down state.

At this moment, the level of the control signal CL15 is "L", and the level of the control signal CL20 is "H". The control circuit 25 outputs only the CLK first-stage enable signal CLK1 in the enable state ("L" level), and outputs the other signals including the CLKB BDD enable signal BDDBI, the CLKB first-stage enable signal CLKBI, and the CLKB BDD enable signal BDDI in-the disable state ("H" level).

Accordingly, from among the BDD signal generating circuits, the CLK first-stage circuit 1 and the replica circuit 3 are in the active state, and the other circuits including the CLKB first-stage circuit 2, the NAND circuits 7 and 8, and the direction selecting circuits 13, 15, 14 and 16 are deactivated.

As a result, the CLK first-stage circuit 1 and the replica circuit 3 are in the enable state, and the circuits composing the BDD signal generating circuits other than these two circuits are brought into the stop state.

Then, at time t4, the level of the clock enable signal CKE becomes "H", and the level of the control signal PWDN transfers from "H" to "L". The operating mode of the semiconductor storage unit is therefore released from the active power down state, and transfers to the standby state. The CLKB first-stage circuit 2, the NAND circuits 7 and 8, and the direction selecting circuits 13, 15, 14 and 16 are activated.

At this moment, the CLK first-stage circuit 1, not stopped but operating, outputs the CLK first-stage output signal CLK upon startup of the clock signal CLK at time t5.

The replica circuit 3 delays the CLK first-stage output signal CLK1. and outputs the same as an output signal CLK2 to the replica circuit 9 via the NAND circuit 7.

The replica circuit 9 delays the output signal CLK2, and outputs the same as the CLK start signal BDDS.

At this moment, the BDD selecting circuit 11 is set to the "in use" state of the delay line 19.

The BDD selecting circuit 11 performs control so as to cause the direction selecting circuit 13 to enter the above-mentioned CLK BDD start signal BDDS and start delaying processing in the delay line 17, on the basis of the control signal issued upon input of the output signal CLK2 by the replica circuit 9.

As a result, the direction selecting circuit 13 causes the delay line 17 to start delaying on the basis of the entered CLK BDD start signal BDDS.

The delay line 17 starts output of the negative logic CLK BDD signal PHA.

Then, at time t51, the CLKB first-stage circuit 2 outputs the CLKB first-stage output signal CLKB1 upon startup of the clock signal CLKB.

Then, the replica circuit 4 delays the CLKB first-stage output signal CLKB1, and outputs the same as the output signal CLKB2 to the replica circuit 10 via the NAND circuit 8.

The replica circuit 10 delays the output signal CLKB2, and outputs the same as the CLKB start signal BDDBS.

At this moment, the BDD selecting circuit 12 assumes the delay line 20 as set to be "in use" state.

The BDD selecting circuit 12 performs control so as to cause the direction selecting circuit 14 to enter the above-mentioned CLKB BDD start signal BDDBS and start delaying processing in the delay line 18.

As a result, the direction selecting circuit 14 causes the delay line 18 to start delaying on the basis of the entered CLKB BDDS start signal BDDBS.

The delay line 18 starts of the negative logic CLKB BDD signal PHC.

Then, at time t6, the level of the control signal READ generated by the read command is changed from "L" to "H" at a timing of the clock signal CLK.

The CLK first-stage circuit 1 outputs the CLK first-stage output signal CLK1 upon startup of the clock signal CLK.

Then, the replica circuits 3 and 9, as at time t5, output the output signal CLK2 and the CLK start signal BDDS.

At this point in time, the direction selecting circuit 13 reverses the direction of propagation of signal through the delay line 17 on the basis of input of the above-mentioned output signal CLK2.

That is, the direction selecting circuit 13 turns up signal propagation for delaying in the delay line 17.

Because the delay line 17 is set to a state "in use", the BDD selecting circuit 11 outputs a control signal for turnup processing at the delay line to the direction selecting circuit 13.

The BDD selecting circuit 11 performs control so as to cause the direction selecting circuit 15 to enter the above-mentioned CLK BDD start signal BDDS, and start delaying processing in the delay line 19, on the basis of the control signal output upon input of the output signal CLK2 by the replica circuit 9.

As a result, the direction selecting circuit 15 causes start delaying through the delay line 19 on the basis of the entered CLK BDD start signal BDDS.

The delay line 19 starts outputting the negative logic CLK BDD signal PHB.

Then, at time t61, the CLKB first-stage 2 outputs the CLKB first-stage output signal CLKB1 upon the startup of the clock signal CLKB.

The replica circuits 4 and 10, as at time t51, output the output signal CLKB2 and the CLKB start signal BDDBS, respectively.

The direction selecting circuit 14 reverses the direction of signal propagation in the delay line 18, on the basis of input of the above-mentioned output signal CLKB2.

That is, the direction selecting circuit 14 turns up signal propagation for delaying in the delay line 18.

Because the delay line 18 is already set as being "in use", the BDD selecting circuit 12 outputs a control signal conducting turnup to the direction selecting circuit 14 at the delay line.

The BDD selecting circuit 12 performs control so as to cause the direction selecting circuit 16 to enter the above-mentioned CLKB BDD start signal BDDBS, and start delaying processing at the delay line 20, on the basis of the control signal output upon input of the output signal CLKB2 by the replica circuit 10.

As a result, the direction selecting circuit 16 causes start of delaying at the delay line 20 on the basis of the entered CLKB BDDS start signal BDDBS.

The delay line 20 starts output of the negative logic CLKB BDD signal PHD.

Then, at time t66, the delay line 17 finishes the entire propagation of the delay elements after turnup, and the CLK BDD signal PHA is started up.

The OR circuit 21 outputs the negative logic CLK BDD signal PHAB on the basis of startup of the CLK BDD signal PHA.

As a result, at time t7, the OR circuit 23 outputs the BDD signal BDDO to the output circuit 24, and the output circuit 24 outputs the DQS signal.

The DQS signal is output in synchronization with startup of the clock signal CLK 1.0 cycle after input of the read command.

At time t74, the delay line 18 completes the entire propagation of the delay elements after turnup, and the CLKB BDD signal PHC is started up.

The OR circuit 22 outputs the negative logic CLKB BDD signal PHCS on the basis of startup of the CLKB BDD signal PHC.

As a result, at time t8, the OR circuit 23 outputs the BDD signal BDDO to the output circuit 26, and the output circuit 26 outputs top data of the burst data.

The top data of the burst data are output in synchronization with startup of the clock signal CLK 2.0 cycles after input of the read command, i.e., at time t8 which is the timing of a CAS latency of 2.0.

Subsequently, BDD signals BDDO are sequentially output similarly from the OR circuit 23, and data read out in the latch of the output circuit 26 are output from the semiconductor storage unit time-serially as burst data.

Operating/stoppage state of the BDD generating circuit during active power down in a case with a CAS latency of "1.5" will be described with reference to FIGS. 4 and 9.

Figure 9:
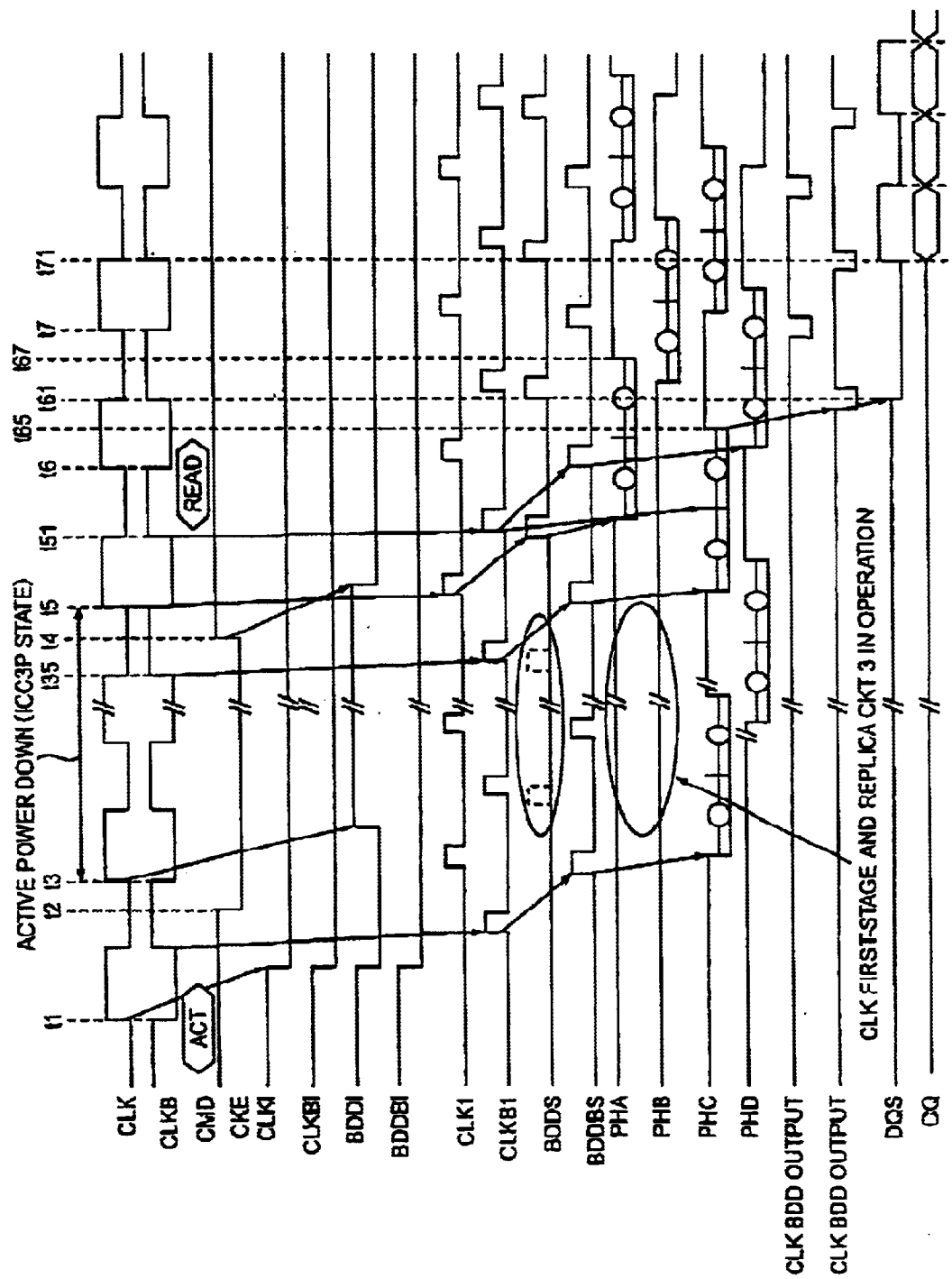
FIG. 9 is a timing chart illustrating a typical operation during active power down in a case with a CAS latency of 1.5 in the first embodiment.

FIG. 9 is a timing chart for explaining stoppage state of the BDD signal generating circuit during active power down with a CAS latency of "1.5", and operation upon input of the read command after release of active power down.

As is clear from FIG. 9, when the state changes from stoppage of the BDD signal generating circuit during active power down to the active state, it is necessary to output first burst data 1.5 cycles after input of the read command.

The DQS signal (data strobe signal) output one cycle prior to output of data must be output in synchronization with startup of the clock signal CLK half a cycle (0.5 cycles) after the read command.

In order to generate a BDD signal, therefore, it is necessary to provide two cycles of clock signal CLK. It is therefore necessary to start operation of the CLKB first-stage circuit 2, 1.5 cycles prior to input of the read command.

At this point in time, the level of the clock enable signal CKE changes from "L" to "H", and the read command is entered one cycle on the minimum after release of the active power down state by the next clock signal CLK. The first data of the burst data are output one cycle and 1.5 cycles corresponding to a CAS latency of 1.5, i.e., 2.5 cycles after release of the active power down state.

Startup of the clock signal CLKB at time t35 is necessary for generating the BDD signal. When the CLKB enable signal CLKBI is in the disable state, however, if all the circuits are stopped in the control with a CAS latency of 1.5, there is a shortage of one cycle for startup timing of the clock signal CLKB during the necessary processing cycles.

It is therefore impossible to stop all the circuits of the BDD signal generating circuits as in the case of a CAS latency of 2.0. In the case of a CAS latency of 1.5, the level of the CLK first-stage enable signal CLKI, the CLKB enable signal CLKBI, and the CLKB BDD enable signal BDDBI is changed by the control circuit 25 to "L". The CLK first-stage circuit 1, the replica circuit 3, the CLKB first-stage circuit 2, the replica circuit 4, the NAND circuit 8, and the direction selecting circuits 13 to 16 are activated (operating). The level of only the CLKB BDD enable signal BDDI is brought to "H", and the replica circuit 9 and the NAND circuit 7 are stopped.

Active power down operation at a CAS latency of 1.5 will now be described.

At time t1, the active (ACT) command is entered, and the clock enable signal CKE is in the enable state ("H" level). As in the case of CAS latencies of 2.5 and 2.0, all the circuits of the BDD signal generating circuit including the CLK first-stage circuit 1, the CLKB first-stage circuit 2, the NAND circuits 7 and 8, and the direction selecting circuits 13, 15, 14 and 16 are activated, and consequently, all the circuits are in operating state.

Then, at time t2, the level of the clock enable signal CKE becomes "L", and the level of the control signal PWDN transfers from "L" to "H" upon startup of the clock signal CLK at time t3. The operating mode of the semiconductor storage unit therefore transfers to the active power down state.

At this moment, the control signal CL15 is on "H" level, and the control signal CL20 is on "L" level. Therefore, the control circuit 25 outputs the CLK BDD enable signal BDDI in the disable state ("H" level) and all the CLKB BDD enable signal BDDBI, the CLK first-stage enable signal CLKI, and the CLKB first-stage enable signal CLKBI in the enable state ("L" level).

As a result, from among the BDD signal generating circuits, in the active power down state, only the output terminal of the NAND circuit 7 and the subsequent circuits are in stoppage. The system of the CLKB first-stage circuit 1 is in operating state, and outputs the CLKB BDD signals PHC and PHD.

Then, at time t35, the CLKB first-stage circuit 2 outputs the CLKB first-stage output signal CLKB1 upon startup of the clock signal CLKB.

Then, the replica circuit 4 delays the CLKB first-stage output signal CLKB1, and outputs the same as an output signal CLKB2 to the replica circuit 10 via the NAND circuit 8.

The replica circuit 10 delays the output signal CLKB2, and outputs the same as the CLKB start signal BDDBS.

At this point in time, the BDD selecting circuit 12 assumes the delay line 20 to be set as being "in use".

The BDD selecting circuit 12 performs control so as to cause the direction selecting circuit 14 to enter the above-mentioned CLKB BDD start signal BDDBS, and start delaying operation in the delay line 18 on the basis of the control signal output upon input of the output signal CLKB2 by the replica circuit 10.

As a result, the direction selecting circuit 14 causes start of delaying in the delay line 18 on the basis of the entered CLKB BDD start signal BDDBS.

The delay line 18 starts output of the negative logic CLKB BDD signal PHC.

Then, at time t4, the level of the clock enable signal CKE becomes "H", and the level of the control signal PWDN transfers from "H" to "L". The operating mode of the semiconductor storage unit is released from the active power down stage, and transfer to standby state. The NAND circuit 7 and the subsequent circuits so far stopped are activated, and all the circuits are activated.

At time t5, the CLK first-stage circuit 1 outputs the CLK first-stage output signal CLK1 upon startup of the clock signal CLK.

Then, the replica circuit 3 delays the CLK first-stage output signal CLK1, and outputs the same as the output signal CLK2 to the replica circuit 9 via the NAND circuit 7.

The replica circuit 9 delays the output signal CLK2, and outputs the same as the CLK start signal BDDS.

At this moment, the BDD selecting circuit 11 assumes the delay line 19 to be already set as being "in use".

The BDD selecting circuit 11 performs control so as to cause the direction selecting circuit 13 to enter the above-mentioned CLK BDD start signal BDDS, and start delaying processing at the delay line 17 on the basis of the control signal output upon input of the output signal CLK2 by the replica circuit 9.

As a result, the direction selecting circuit 13 causes start of delaying at the delay line 17 on the basis of the entered CLK BDDS start signal BDDS.

The delay line starts output of the negative logic CLK BDD signal PHA.

Then, at time t51, the CLKB first-stage circuit 2 outputs the CLKB first-stage output signal CLKB1 upon startup of the clock signal CLKB.

The replica circuits 4 and 10, as at time t35, output the output signal CLKB2 and the CLKB start signal BDDBS, respectively.

The direction selecting circuit 14 reverses the direction of signal propagation in the delay line 18 on the basis of input of the above-mentioned output signal CLKB2.

That is, the direction selecting circuit 14 turns up signal propagation for delaying in the delay line 18.

Because the delay line 18 is set as already being "in use", the BDD selecting circuit 12 outputs the control signal for conducting turnup processing to the direction selecting circuit 14.

The BDD selecting circuit 12 performs control so as to cause the direction selecting circuit 16 to enter the above-mentioned CLKB BDD start signal BDDBS and starts delaying operation in the delay line 20, on the basis of the control signal output upon input of the output signal CLKB2 by the replica circuit 10.

As a result, the direction selecting circuit 16 starts delaying in the delay line 20 on the basis of the entered CLKB BDDS start signal BDDBS.

The delay line 20 starts output of the negative logic CLKB BDD signal PHD.

Then, at time t6, the level of the control signal READ generated by the read command changes from "L" to "H" at the timing of the clock signal CLK.

The CLK first-stage circuit 1 outputs the CLK first-stage output signal CLK1 upon startup of the clock signal CLK.

The replica circuits 3 and 9, as at time t5, output the output signal CLK2 and the CLK start signal BDDS, respectively.

The direction selecting circuit 13 reverses the direction of signal propagation in the delay line 17 on the basis of input of the above-mentioned output signal CLK2.

That is, the direction selecting circuit 13 turns up the signal propagation for delaying at the delay line 17.

At this point in time, since the delay line 17 is set as already being "in use", the BDD selecting circuit 11 outputs the control signal for turnup processing at the delay line 17 to the direction selecting circuit 13.

The BDD selecting circuit 11 performs control so as to cause the direction selecting circuit 15 to enter the abovementioned CLK BDD start signal BDDS, and start delaying processing at the delay line 19, on the basis of the control signal output upon input of the output signal CLK2 by the replica circuit 9.

As a result, the direction selecting circuit 15 causes start of delaying at the delay line 19 on the basis of the entered CLK BDDS start signal BDDS.

The delay line 19 starts output of the negative logic CLK BDD signal PHB.

Then, at time t65, the delay line 18 completes propagation of the delay elements after turnup, and the CLKB BDD signal PHC is started up.

The OR circuit 22 outputs the negative logic CLKB BDD signal PHCD on the basis of the startup of the CLKB BDD signal PHC.

As a result, at time t61, the OR circuit 23 outputs the BDD signal BDDO to the output circuit 24, and the output circuit 24 outputs the DQS signal.

The DQS signal is output in synchronization with startup of the clock signal CLK 0.5 cycles after input of the read command.

Similarly, at time t67, the delay line 17 totally completes propagation of the delay elements after turnup, and the CLK BDD signal PHA is started up.

The OR circuit 21 outputs the negative logic CLK BDD signal PHAB on the basis of startup of the CLK BDD signal PHA.

As a result, at time t71, the OR circuit 23 outputs the BDD signal BDDO to the output circuit 26, and the output circuit 26 outputs the top data of the burst data.

The top data of the burst data are output in synchronization with end of the clock signal CLK at time t71 1.5 cycles after input of the read command, which is the timing of a CAS latency of 1.5.

Subsequently, BDD signals BDDO are sequentially output similarly from the OR circuit 23, and the data read out in the latch of the output circuit 26 are output from the semiconductor storage unit time-serially as burst data.

As described above, while the conventional semiconductor storage unit cannot reduce the power consumption, in the semiconductor storage unit of the first embodiment of the present invention, the control circuit 25 according to the first embodiment controls operation/stoppage of unnecessary circuits in the BDD signal generating circuits in response to the value of CAS latency. It is therefore possible to perform power-saving control in response to the individual CAS latency while satisfying specifications of output timing of CAS latency from the read command, and the power consumption during active power down can be reduced.

In the semiconductor storage unit of the first embodiment, from among the BDD signal generating circuits, the CLK first-stage circuit 1, the CLKB first-stage circuit 2, the NAND circuits 7 and 8, and the direction selecting circuits 13 to 16 are disabled under control of the control circuit 25. By discontinuing output signals from these circuits, operation/stoppage of the individual circuits of the BDD signal generating circuits is controlled. It is therefore possible to achieve power saving in response to individual values of CAS latency without largely changing the circuit configuration.

An embodiment of the present invention has been described in detail above with reference to the drawings. The concrete configuration is not however limited to that of the first embodiment, but design variants within the scope not leaving the spirit of the invention are included in the invention.

Figures 10, 11:
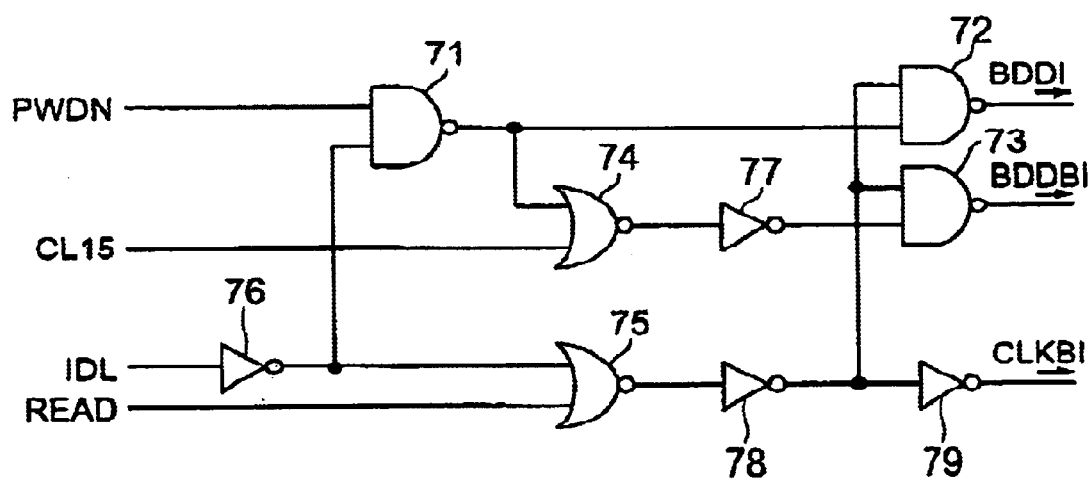
FIG. 10 is a block diagram illustrating the configuration of the control circuit 25A (second embodiment) shown in FIG. 4.
FIG. 11 is a table showing the relationship between the value of CAS latency and the individual enable signals during active power down of the control circuit 15A (second embodiment) shown in FIG. 6.

For example, a configuration in which the control circuit 25 shown in FIG. 3 is replaced by the one 26A shown in FIG. 10 is presented as a second embodiment.

The second embodiment has the same configuration as in the first embodiment except that the CLK enable signal CLKI and the CLKB enable signal CLKBI in the first embodiment are replaced by a single CLKB enable signal CLKBI in the second embodiment.

The configuration of the BDD signal generating circuits other than the control circuit is the same as in the first embodiment except that the CLKB enable signal CLKBI is entered in place of the CLK enable signal CLKI. Description of the circuits other than the control circuit 25 is therefore omitted.

A typical configuration of the control circuit 25A will now be described with reference to FIGS. 10 and 11. FIG. 10 is a conceptual view illustrating a typical configuration of the control circuit 25A.

FIG. 11 is a table showing correspondence, on the basis of the circuit shown in FIG. 10, between values of CAS latency during active power down and output levels of the CLK first-stage enable signal CLKI, the CLKB first-stage enable signal CLKBI, the CLK BDD enable signal BDDI, and the CLKB BDD enable signal BDDBI.

Referring to FIGS. 10, 71 to 73 represent NAND circuits; 74 and 75, NOR circuits; and 76 to 79, NOT circuits (inverters).

For the control signal PWDN, the control signal IDL, and the control signal READ used in the control circuit 25A, which are the same as in the first embodiment, the description is omitted here.

In the active power down state, the level of the abovementioned control signals are: "H" for the control signal PWDN; "L" for the control signal READ; and "L" for the control signal IDL.

The control signal CL15 is set by the mode register set command, and takes a level based on the value of CAS latency stored in the register.

That is, the level of the control signal CL15 is "H" when the CAS latency is "1.5", and "L" when the CAS latency is "2.5" or "2.0".

Figure 8:
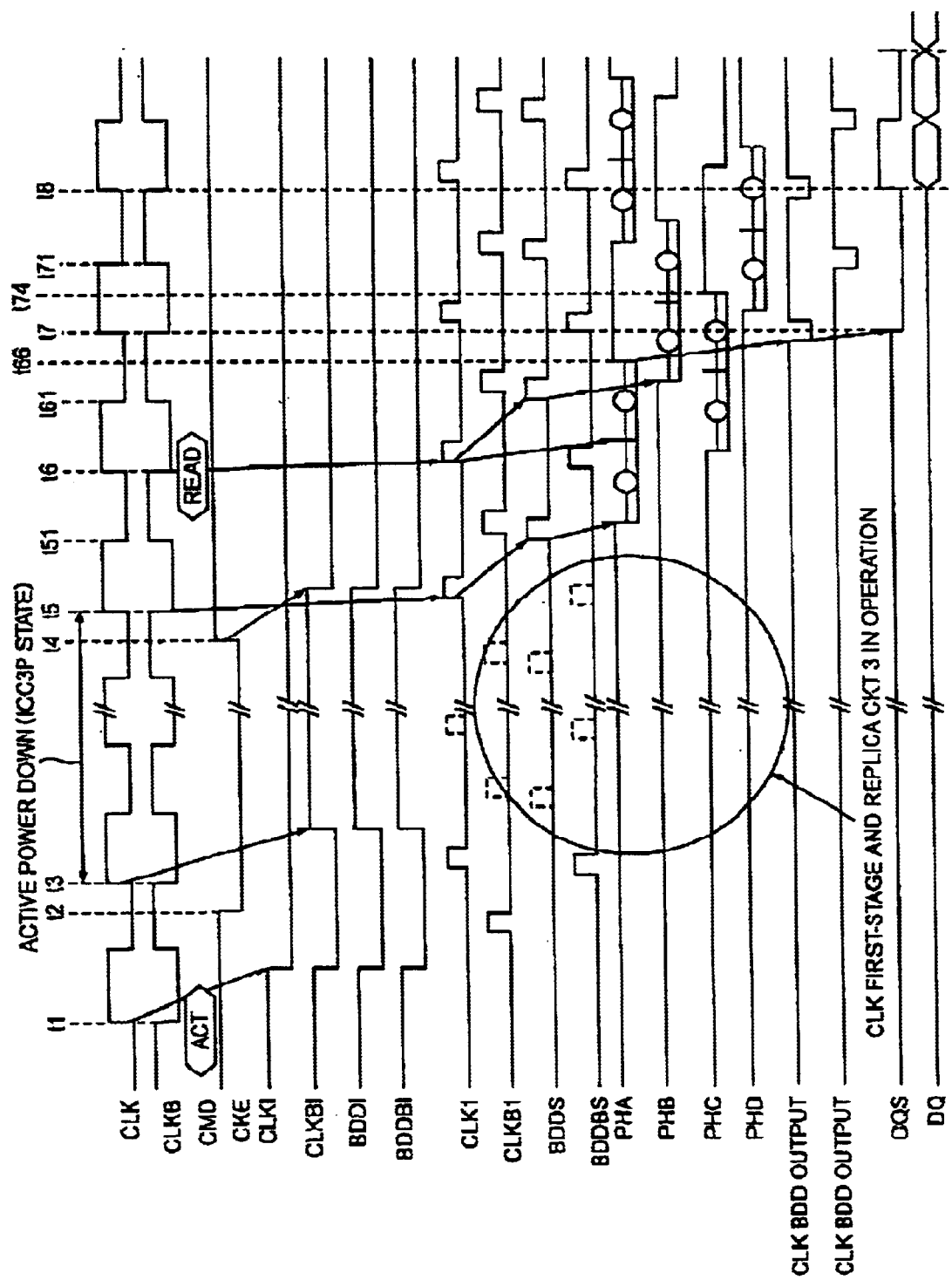
FIG. 8 is a timing chart illustrating a typical operation during active power down in a case with a CAS latency of 2.0 in the first embodiment.

As shown in the table shown in FIG. 8, during active power down, on the basis of the above-mentioned state of the individual control signals, the level of the CLK BDD enable signal BDDI, the CLKB BDD enable signal BDDBI, and the CLK/CLKB first-stage enable signal CLKBI is "H", "L" and "L" when the CAS latency is "1.5"; and "H", "H" and "L" when the CAS latency is "2.0" or "2.5".

That is, when the CAS latency is "2.0" or "2.5", the CLK BDD enable signal BDDI, the CLKB BDD enable signal BDDBI, and the CLK/CLKB first-stage enable signal CLKBI have the same value.

The above-mentioned CLK BDD enable signal BDDI, CLKB BDD enable signal BDDBI and CLK/CLKB first-stage enable signal CLKBI are "L" active.

Typical operations of the BDD generating circuit in the second embodiment will now be described with reference to the drawings.

A CAS latency of 2.5 can be coped with by satisfying the latency 2.0 from the read command so far as a CAS latency is coped with. The description is therefore omitted here.

As is understood from comparison of FIGS. 8 and 3, the values of the CLK BDD enable signal BDDI, the CLKB BDD enable signal BDDBI, and the CLK/CLKB first-stage enable signal CLKBI in the second embodiment are the same as in the first embodiment, and operations during active power down in the second embodiment are the same as in the timing chart shown in FIG. 9. The description of the active power down in the second embodiment is therefore omitted here.

Operation/stoppage states of the BDD generating circuits during active power down with a CAS latency of "2.0" will therefore be described with reference to FIGS. 4 and 12.

Figure 12:
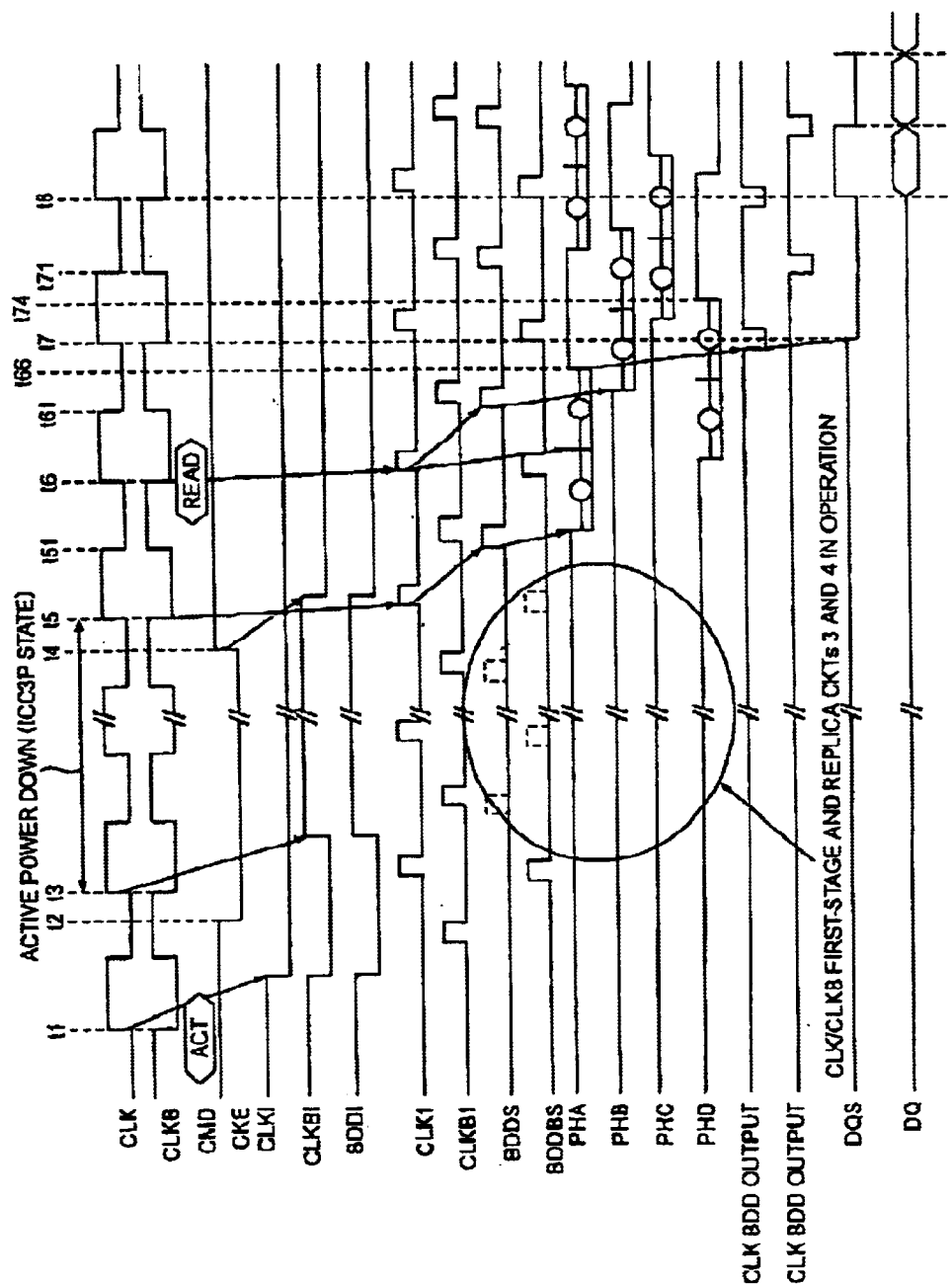
FIG. 12 is a timing chart illustrating a typical example during active power down in the base with a CAS latency of 2.0 in the second embodiment.

FIG. 12 is a timing chart for explaining the stoppage state of the BDD signal generating circuits during active power down of the BDD signal generating circuits with a CAS latency of "2.0" and operations upon input of the read command after release of active power down state.

As is clear from FIG. 12, when the state of the BDD signal generating circuits during active power down transfers from stoppage to active, it is necessary to output the first burst data 2.0 cycles after input of the read command.

The DQS (data strobe signal) signal output one cycle prior to output of data must be output in synchronization with startup of the clock signal CLKB 1.0 cycle after the read command.

Generation of a BDD signal therefore requires two cycles of clock signal, and the CLK first-stage circuit 1 must start operation one cycle prior to input of the read command.

This differs from the case of a CAS latency of 2.0 in the first embodiment in that, while the CLK first-stage circuit 1 and the replica circuit 3 are operated in the first embodiment, the CLKB first-stage circuit 2 and the replica circuit 4 are also operated in the second embodiment.

Processing of active power down with a CAS latency of 2.0 will now be described.

At time t1, the active command is entered; the clock enable signal CKE is in enable state ("H" level); the unit is therefore active; all the BDD signal generating circuits including the CLK first-stage circuit 1, the CLKB first-stage circuit 2, the NAND circuits 7 and 8, and the direction selecting circuits 13, 15, 14 and 16 are activated. All the circuits are therefore in the activated state.

Then, at time t2, the level of the clock enable signal CKE transfers to "L", and the level of the control signal PWDN transfers from "L" to "H" upon startup of the clock signal CLK at time t3. The operating mode of the semiconductor storage unit therefore transfers to the active power down state.

At this moment, because the level of the control signal CL15 is "L", the control circuit 25A outputs the CLK BDD enable signal BDDI and the CLKB BDD enable signal BDDBI in the disable state ("H" level), and outputs the CLK/CLKB first-stage enable signal CLKBI in the enable state ("L" level).

As a result, from among the BDD signal generating circuits, the CLK first-stage circuit 1, the CLKB first-stage circuit 2 and the replica circuits 3 and 4 are in active state, and the other NAND circuits 7 and 8 and the direction selecting circuits 13, 15, 14 and 16 are deactivated.

Consequently, the CLK first-stage circuit 1, the CLKB first-stage circuit 2 and the replica circuits 3 and 4 are in the enable state, and the circuits composing the BDD signal generating circuits other than these two circuits are stopped.

Then, at time t4, the level of the clock enable signal CKE becomes "H" and the level of the control signal PWDN transfers from "H" to "L". The operating mode of the semiconductor storage unit is therefore released from the active power down state, transferring to the standby state, and the CLKB first-stage circuit 2, the NAND circuits 7 and 8, and the direction selecting circuits 13, 15, 14 and 16 are activated by the control circuit 25A.

At this moment, the CLK first-stage circuit 1 and the CLKB first-stage circuit 2 are not stopped, but continues operating. The CLK first-stage circuit 1 therefore outputs the CLK first-stage output signal CLK1 upon startup of the clock signal CLK at time t5.

The replica circuit 3 delays the CLK first-stage output signal CLK1, and outputs the same as the output signal CLK2 to the replica circuit 9 via the NAND circuit 7.

The replica circuit 9 delays the output signal CLK2 and outputs the same as the CLK start signal BDDS.

At this moment, the BDD selecting circuit 11 assumes the delay line 19 to be set as already being "in use".

The BDD selecting circuit 11 performs control so as to cause the direction selecting circuit 13 to enter the above-mentioned CLK BDD start signal BDDS and start delaying at the delay line 17, on the basis of the control signal output upon input of the output signal CLK2 on the basis of the control signal output upon input of the output signal CLK2 by the replica circuit 9.

As a result, the direction selecting circuit 13 causes start of delaying in the delay line 17 on the basis of the entered CLK BDD start signal BDDS.

The delay line 17 starts output of the negative logic CLK BDD signal PHA.

Then, at time t51, the CLKB first-stage circuit 2 outputs the CLKB first-stage output signal CLKB1 upon startup of the clock signal CLKB.

Then, the replica circuit 4 delays the CLKB first-stage output signal CLKB1, and output the same as the output signal CLKB2 to the replica circuit 10 via the NAND circuit 8.

The replica circuit 10 delays the output signal CLKB2, and outputs the same as the CLKB start signal BDDBS.

At this point in time, the BDD selecting circuit 12 assumes the delay line 20 as already being "in use".

The BDD selecting circuit 12 conducts control so as to cause the direction selecting circuit 14 to enter the above-mentioned CLKB BDD start signal BDDBS, and start delaying processing in the delay line 18, on the basis of the control signal output upon input of the output signal CLKB2.

As a result, the direction selecting circuit 14 causes start of delaying in the delay line 18 on the basis of the entered CLKB BDD start signal BDDBS.

The delay line 18 starts output of the negative logic CLKB BDD signal PHC.

Then, at time t6, the level of the control signal READ generated by the read command transfers from "L" to "H" at the timing of the clock signal CLK.

The CLK first-stage circuit 1 outputs the CLK first-stage output signal CLK1 upon startup of the clock signal CLK.

Then, the replica circuits 3 and 9, as at time t5, output the output signal CLK2 and the CLK start signal BDDS, respectively.

The direction selecting circuit 13 reverses the direction of signal propagation in the delay line 17 on the basis of input of the above-mentioned output signal CLK2.

That is, the direction selecting circuit 13 turns up the signal propagation for delaying in the delay line 17.

At this moment, because the delay line 17 is set as already being "in use", the BDD selecting circuit 11 outputs a control signal for performing turnup in the delay line 17 to the direction selecting circuit 13.

The BDD selecting circuit 11 performs control so as to cause the direction selecting circuit 15 to enter the above-mentioned CLK BDD start signal BDDS and start delaying in the delay line 19, on the basis of the control signal output upon input of the output signal CLK2 by the replica circuit 9.

As a result, the direction selecting circuit 15 causes start of delaying in the delay line 19 on the basis of the entered CLK BDD start signal BDDS.

The delay line 19 starts output of the negative logic CLK BDD signal PHB.

Then, at time t61, the CLKB first-stage circuit 2 outputs the CLKB first-stage output signal CLKB1 upon startup of the clock signal CLKB.

The replica circuits 4 and 10, as at time t51, output the output signal CLKB2 and the CLKB start signal BDDBS, respectively.

The direction selecting circuit 14 reverses the direction of signal propagation at the delay line 18 on the basis of input of the above-mentioned output signal CLKB2.

That is, the direction selecting circuit 14 turns up the signal propagation for delaying in the delay line 18.

At this moment, the BDD selecting circuit 12 outputs a control signal for turning up in the delay line 18 to the direction selecting circuit 14, because the delay line 18 is set as already being in use.

The BDD selecting circuit 12 performs control so as to cause the direction selecting circuit 16 to enter the CLKB BDD start signal BDDBS and start delaying in the delay line 20, on the basis of the control signal output upon input of the output signal CLKB2 by the replica circuit 10.

As a result, the direction selecting circuit 16 starts delaying in the delay line 20 on the basis of the entered CLKB BDDS start signal BDDBS.

The delay line 20 starts output of the negative logic CLKB BDD signal PHD.

Then, at time t66, the delay line 17 totally completes propagation of the delay elements after turnup, and the CLK BDD signal PHA is started up.

The OR circuit 21 outputs the negative logic CLK BDD signal PHAB on the basis of startup of the CLK BDD signal PHA.

As a result, at time t7, the OR circuit 23 outputs the BDD signal BDDO to the output circuit 24, and the output circuit 24 outputs the DQS signal.

The DQS signal is output in synchronization with startup of the clock signal CLK 1.0 cycle after input of the read command.

At time t74, similarly, the delay line 18 totally completes propagation of the delay elements after turnup, and the CLKB BDD signal PHC is started up.

The OR circuit 22 outputs the negative logic CLKB BDD signal PHCD on the basis of startup of the LKB BDD signal PHC.

As a result, at time t8, the OR circuit 23 outputs the BDD signal BDDO to the output circuit 26, and the output circuit 26 outputs the top data of the burst data.

The top data of the burst data are output in synchronization with startup of the clock signal CLK 2.0 cycles after input of the read command, i.e., at time t8 which is the timing for a CAS latency of 2.0.

Subsequently, the BDD signals BDDO are sequentially output from the OR circuit 23, and the data read out in the latch of the output circuit 26 are time-serially output as burst data from the semiconductor storage unit.

As described above, while the conventional semiconductor storage unit cannot reduce the power consumption, in the semiconductor storage unit of the second embodiment of the present invention, the control circuit 25A according to the second embodiment controls operation/stoppage of unnecessary circuits in the BDD signal generating circuits in response to the value of CAS latency. It is therefore possible to perform power-saving control in response to the individual CAS latency while satisfying specifications of output timing of CAS latency from the read command, and the power consumption during active power down can be reduced.

In the semiconductor storage unit of the second embodiment, as in the first embodiment, from among the BDD signal generating circuits, the CLK first-stage circuit 1, the CLKB first-stage circuit 2, the NAND circuits 7 and 8, and the direction selecting circuits 13 to 16 are disabled under control of the control circuit 25. By discontinuing output signals from these circuits, operation/stoppage of the individual circuits of the BDD signal generating circuits is controlled. It is therefore possible to achieve power saving in response to individual values of CAS latency without largely changing the circuit configuration.

In the second embodiment, as compared with the first embodiment, the cut amount of power consumption during active power down is smaller. However, because the logic is simplified, the number of wiring lines (one for input, and one for output) is reduced, and it is possible to achieve power saving with smaller number of modifications from the conventional circuits.

In the above-mentioned first and second embodiments, the BDD circuits have been described. Also in SMD circuits, it is needless to mention that it is possible to achieve power saving by changing the direction controlling circuits 13 to 16 and the delay lines 17 to 20 into SMD circuits.

According to the semiconductor storage unit of the present invention, in contrast to the impossibility to reduce the power consumption in the conventional semiconductor storage unit, the control circuits 25 and 25A in the first and second embodiments control operation/stoppage of the individual circuits composing the BBD signal generating circuits in response to values of CAS latency. It is therefore possible to achieve power saving while satisfying the specifications for the output timing at various values of CAS latency from the read command, and it is thus possible to reduce the power consumption during active power down.

While this invention has thus far been disclosed in conjunction with several embodiments thereof, it will be readily possible for those skilled in the art to put this invention into practice in various other manners.

What is claimed is:

1. A semiconductor storage unit, comprising:
   a clock input first-stage circuit for receiving an external clock signal;
   an output circuit for outputting data stored in memory cells in synchronization with an output clock generated based upon the external clock signal;
   a delay adjusting circuit which has a plurality of delay circuits and which corrects a phase shift between the external clock and the data by delaying the output clock and which achieves synchronization between the external clock signal and the data; and a control circuit which controls operation of each of the delay circuits based upon CAS latency during active power down and controls halting of each of the delay circuits.

2. The unit as claimed in claim 1, wherein:

the control circuit operates or halts any one of the delay circuits based upon a value of the CAS latency.

3. A semiconductor storage unit, comprising:

a clock input first-stage circuit which is given an external clock signal;

an output circuit which produces data stored in memory cells in synchronization with an output clock generated based upon the external clock signal;

a delay adjusting circuit which has a plurality of delay circuits and which corrects a phase shift between the external clock and the data by delaying the output clock and which achieves synchronization between the external clock signal and the data; and a control circuit which controls operation and halting of each of the delay circuits, wherein the delay adjusting circuit comprises a replica circuit which includes the clock input first-stage circuit and the output circuit and an adjusting delay circuit which adjusts propagation to an arbitrary amount of delay, as the delay circuits.

4. The unit as claimed in claim 3, wherein:

the adjusting delay circuit adjusts the amount of delay by turning up propagation of the signal at a prescribed point on a delay line having a turnup in an interior in accordance with a predetermined amount of delay in the delay line.

5. A method of controlling a semiconductor storage unit, comprising:

inputting an external clock signal into a clock input first-stage circuit;

generating an output clock based upon on the external clock signal;

producing data stored in a memory cell in synchronization with the output clock;

correcting a phase shift between the external clock and the data by delaying the output clock via a delay adjusting circuit including a plurality of delay circuits in order to achieve synchronization between the external clock signal and the data; and controlling operation and halt for each of the delay circuits, wherein the operation of each of the delay circuits is controlled on the basis of CAS latency during active power down.

6. The method as claimed in claim 5, wherein:

any one of the delay circuits is operated or halted on the basis of a value of the CAS latency during the active power down.

7. A method of controlling a semiconductor storage unit, comprising:

inputting an external clock signal into a clock input first-state circuit;

generating an output clock based upon on the external clock signal;

producing data stored in a memory cell in synchronization with the output clock;

correcting a phase shift between the external clock and the data by delaying the output clock via a delay adjusting circuit including a plurality of delay circuits in order to achieve synchronization between the external clock signal and the data; and controlling operation and halt for each of the delay circuits, wherein the amount of delay is adjusted by the use of a replica circuit which includes the clock input first-stage circuit and the output circuit and an adjusting delay circuit which adjusts propagation to an arbitrary amount of delay in the delaying step.

* * * * *